United States Patent
Do et al.

(10) Patent No.: US 9,324,641 B2
(45) Date of Patent: Apr. 26, 2016

(54) INTEGRATED CIRCUIT PACKAGING SYSTEM WITH EXTERNAL INTERCONNECT AND METHOD OF MANUFACTURE THEREOF

(75) Inventors: Byung Tai Do, Singapore (SG); Arnel Senosa Trasporto, Singapore (SG); Linda Pei Ee Chua, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 249 days.

(21) Appl. No.: 13/425,286

(22) Filed: Mar. 20, 2012

(65) Prior Publication Data
US 2013/0249068 A1 Sep. 26, 2013

(51) Int. Cl.
*H01L 23/495* (2006.01)
*H01L 21/56* (2006.01)
*H01L 23/00* (2006.01)
*H01L 23/31* (2006.01)
*H01L 23/498* (2006.01)

(52) U.S. Cl.
CPC .......... *H01L 23/49541* (2013.01); *H01L 24/32* (2013.01); *H01L 21/568* (2013.01); *H01L 23/3107* (2013.01); *H01L 23/49894* (2013.01); *H01L 2224/48095* (2013.01); *H01L 2224/48247* (2013.01); *H01L 2224/73265* (2013.01); *H01L 2224/83005* (2013.01); *H01L 2224/83385* (2013.01); *H01L 2224/85005* (2013.01); *H01L 2924/10253* (2013.01); *H01L 2924/15311* (2013.01); *H01L 2924/181* (2013.01)

(58) Field of Classification Search
CPC ... H01L 21/6734; H01L 23/495; H01L 21/56; H01L 23/49541; H01L 24/32
USPC .......................................................... 257/676
See application file for complete search history.

(56) References Cited

U.S. PATENT DOCUMENTS

| | | | |
|---|---|---|---|
| 5,592,025 A | 1/1997 | Clark et al. | |
| 5,830,800 A | 11/1998 | Lin | |
| 5,976,912 A | 11/1999 | Fukutomi et al. | |
| 6,611,063 B1 | 8/2003 | Ichinose et al. | |
| 8,169,058 B2* | 5/2012 | Pagaila et al. | 257/629 |
| 2002/0089041 A1* | 7/2002 | Scherbarth et al. | 257/666 |
| 2008/0217739 A1* | 9/2008 | Lien | H01L 23/49822 257/535 |
| 2010/0187651 A1* | 7/2010 | Jin | H01L 21/486 257/528 |
| 2010/0224981 A1* | 9/2010 | Lam | H01L 21/4832 257/690 |
| 2011/0057301 A1 | 3/2011 | Chen et al. | |
| 2012/0061855 A1* | 3/2012 | Do | H01L 21/561 257/778 |
| 2012/0280377 A1* | 11/2012 | Do et al. | 257/676 |

OTHER PUBLICATIONS

U.S. Appl. No. 13/102,041, filed May 5, 2011, Do et al.

(Continued)

*Primary Examiner* — Evan Pert
*Assistant Examiner* — Damon Hillman
(74) *Attorney, Agent, or Firm* — Ishimaru & Associates LLP

(57) ABSTRACT

A method of manufacture of an integrated circuit packaging system includes: providing a routable distribution layer on a leadframe; mounting an integrated circuit over the routable distribution layer; encapsulating with an encapsulation over the routable distribution layer; peeling the leadframe away from the routable distribution layer with a bottom distribution side of the routable distribution layer exposed from the encapsulation; and mounting an external interconnect on the routable distribution layer.

20 Claims, 5 Drawing Sheets

(56) References Cited

OTHER PUBLICATIONS

U.S. Appl. No. 13/325,881, filed Dec. 14, 2011, Do et al.
McGraw-Hill, "Definition of Peeling", "McGraw-Hill Dictionary of Scientific and Technical Terms", Copyright 2003, p. 1549, Sixth Edition, Publisher: The McGraw-Hill Companies, Inc., Published in: New York.

* cited by examiner

INTEGRATED CIRCUIT PACKAGING SYSTEM WITH EXTERNAL INTERCONNECT AND METHOD OF MANUFACTURE THEREOF

TECHNICAL FIELD

The present invention relates generally to an integrated circuit packaging system, and more particularly to a system for an integrated circuit package with external interconnect.

BACKGROUND ART

Modern electronics, such as smart phones, personal digital assistants, location based services devices, enterprise class servers, or enterprise class storage arrays, are packing more integrated circuits into an ever-shrinking physical space with expectations for decreasing cost. Numerous technologies have been developed to meet these requirements. Some of the research and development strategies focus on new technologies while others focus on improving the existing and mature technologies. Research and development in the existing technologies can take a myriad of different directions.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for lower height, smaller space, and cost reduction.

One proven way to reduce cost is to use mature package technologies with existing manufacturing methods and equipments. Paradoxically, the reuse of existing manufacturing processes does not typically result in the reduction of package dimensions. The demand still continues for lower cost, smaller size and more functionality.

Thus, a need still remains for an integrated circuit packaging system including lower cost, smaller size, and more functionality. In view of the ever-increasing need to improve integration and cost reduction, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a routable distribution layer on a leadframe; mounting an integrated circuit over the routable distribution layer; encapsulating with an encapsulation over the routable distribution layer; peeling the leadframe away from the routable distribution layer with a bottom distribution side of the routable distribution layer exposed from the encapsulation; and mounting an external interconnect on the routable distribution layer.

The present invention provides an integrated circuit packaging system, including: a routable distribution layer with a directionally textured distribution side, characteristic of having a leadframe peeled off therefrom; an integrated circuit over the routable distribution layer; an encapsulation over the routable distribution layer with the bottom distribution side of the routable distribution layer exposed from the encapsulation; and an external interconnect on the routable distribution layer.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
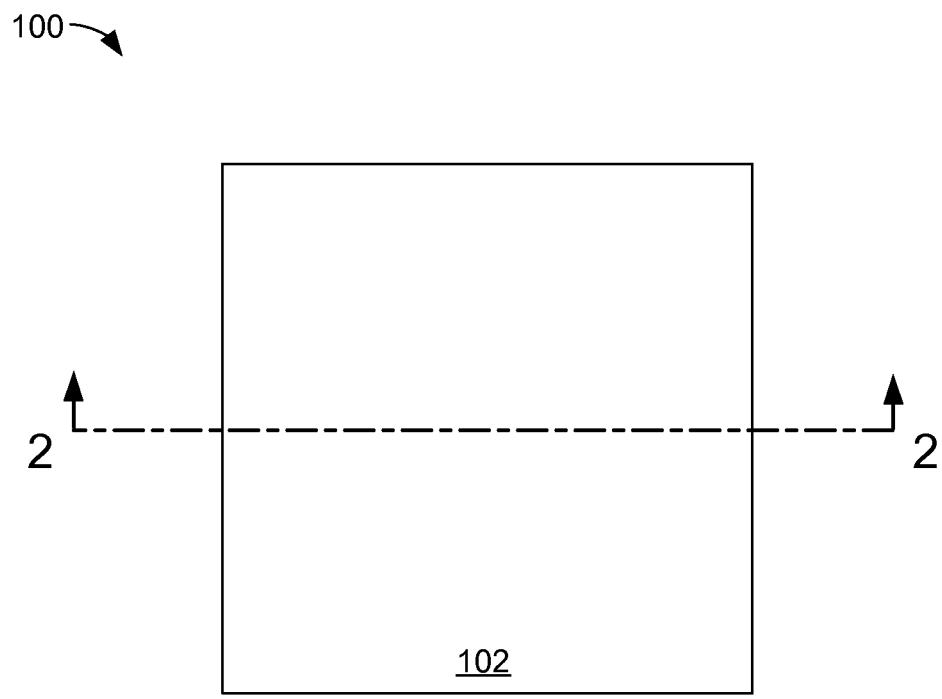
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane of an active surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The top view depicts the integrated circuit packaging system 100 having an encapsulation 102. The encapsulation 102 is defined as a package cover providing a hermetic seal of the contents within the package. For example, the encapsulation 102 can be a molding compound or an epoxy compound.

Figure 2:
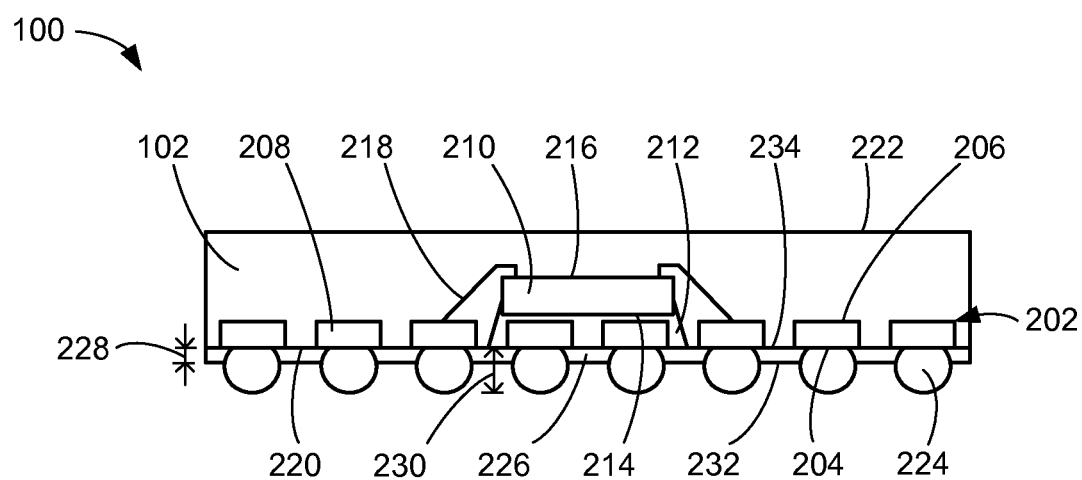
FIG. 2 is a cross-sectional view of the integrated circuit packaging system along line 2-2 of FIG. 1.

Referring now to FIG. 2, therein is shown a cross-sectional view of the integrated circuit packaging system 100 along line 2-2 of FIG. 1.

The integrated circuit packaging system 100 can include a routable distribution layer 202, which is defined as a structure for providing electrical connectivity. The routable distribution layer 202 can include a bottom distribution side 204 opposite from a top distribution side 206.

The routable distribution layer 202 can be, for example, a conductive polymer layer or a plated metal layer. The routable distribution layer 202 can have characteristics of having a leadframe removed therefrom. The characteristics of the routable distribution layer 202 having the leadframe removed therefrom can include characteristics of having the leadframe etched away therefrom. The characteristics of the routable distribution layer 202 having the leadframe etched away therefrom include etch marks, chemical residue, metal residue, or a combination thereof on a surface of the routable distribution layer 202.

The characteristics of the routable distribution layer 202 having the leadframe removed therefrom can include characteristics of the routable distribution layer 202 having the leadframe peeled off therefrom. The characteristics of the routable distribution layer 202 having the leadframe peeled off therefrom can include a smooth surface or tear marks at a periphery of the routable distribution layer 202. The characteristics of the routable distribution layer 202 having the leadframe peeled off therefrom can include the bottom distribution side 204 of the routable distribution layer 202 having a texture of the leadframe or a directional texture in the peel direction.

The encapsulation 102 can have characteristics of having a leadframe peeled off therefrom. The encapsulation 102 can include tear marks or uniform distortion along a peel direction on surfaces near, adjacent, or in contact with the routable distribution layer 202.

The routable distribution layer 202 can include multiple instances of a trace contact 208. An instance of the trace contact 208 can be connected to another instance of the trace contact 208 through the routable distribution layer 202. The routable distribution layer 202 can be a layer of interconnected metal pieces. The routable distribution layer 202 can also be a layer of separate sets of the trace contact 208.

The integrated circuit packaging system 100 can include an integrated circuit 210. The integrated circuit 210 is defined as an active device having active circuitry fabricated thereon. The integrated circuit 210 can be mounted over the routable distribution layer 202. The integrated circuit 210 can be attached to the routable distribution layer 202 with an attachment layer 212, which is defined as a material for attaching the integrated circuit 210. The attachment layer 212 can be an adhesive material. The attachment layer 212 can also be an underfill material.

The integrated circuit 210 can include an inactive side 214 and an active side 216 opposite the inactive side 214. For example, the integrated circuit 210 can be a wirebond chip, a flip chip, or a silicon (Si) die. The integrated circuit 210 can include the inactive side 214 facing the routable distribution layer 202. The integrated circuit 210 can be surrounded by an array of instances of the trace contact 208.

The integrated circuit packaging system 100 can include a die interconnect 218, which is defined as an electrically conductive connector. The die interconnect 218 can be connected to or attached to the routable distribution layer 202 and the active side 216. The integrated circuit packaging system 100 can include a plurality of the die interconnect 218. For example, the die interconnect 218 can be an electrical connector including a wire interconnect, a bond wire, a conductive bump, a solder ball, or a combination thereof.

The integrated circuit packaging system 100 can include the encapsulation 102. The encapsulation 102 can be formed covering over the routable distribution layer 202, the integrated circuit 210, the attachment layer 212, and the die interconnect 218. The encapsulation 102 can include a bottom encapsulation side 220 opposite from a top encapsulation side 222. The bottom encapsulation side 220 can be coplanar with a bottom side of the attachment layer 212 and the bottom distribution side 204 of the routable distribution layer 202. An external interconnect 224 can be directly attached to the bottom distribution side 204 and the external interconnect 224 below the integrated circuit 210.

The integrated circuit packaging system 100 can include an external interconnect 224, which is defined as an electrically conductive connector. The external interconnect 224 can be below the trace contact 208 of the routable distribution layer 202. The external interconnect 224 can be connected to or directly attached to the trace contact 208. The integrated circuit packaging system 100 can include multiple instances of the external interconnect 224.

For example, the external interconnect 224 can be an electrical connector including a conductive pillar or a solder ball. Also for example, the external interconnect 224 can be formed with a conductive material including solder, a conductive polymer, a metal, or a metallic alloy. For a specific example, the external interconnect 224 can be a solder ball for enhancing board level reliability performance. The external interconnect 224 can be attached to the trace contact 208.

The integrated circuit packaging system 100 can include a protective coat 226, which is defined as a protection layer that protects a portion of the bottom extent of the routable distribution layer 202. The protective coat 226 can isolate electrically the trace contact 208 from other instances of the trace contact 208. The protective coat 226 can include an insulation material including a passivation, a solder resist, an epoxy, an adhesive, or a combination thereof. The protective coat 226 can be at a coat height 228 less than a connector height 230 of the external interconnect 224.

The protective coat 226 can be applied for protection or security of circuit or trace, as shown with the routable distribution layer 202 for example. The protective coat 226 can be provided for protections during or after assembly or undesired environmental conditions.

The routable distribution layer 202 can include connected instances of the trace contact 208, each instance connected electrically through a portion of the routable distribution layer 202. The routable distribution layer 202 can be a single layer of multiple pieces isolated by the encapsulation 102 or a single layer of a single connected piece.

The protective coat 226 can be formed or applied directly on portions of the routable distribution layer 202, the encapsulation 102, or a combination thereof. The protective coat 226 can be formed or applied between pieces in the routable distribution layer 202. The protective coat 226 can electrically isolate the routable distribution layer 202 from conductive structures in the integrated circuit packaging system 100. The protective coat 226 can be formed on the routable distribution layer 202 around the external interconnect 224.

The protective coat 226 can be an insulating material. The protective coat 226 can be a penetrable film adhesive material. The protective coat 226 can be a B-stage material. The protective coat 226 can be in sheet or pre-cut form. For example, the protective coat 226 can be a solder mask, a film sheet, an epoxy molding compound, or an encapsulant.

The protective coat 226 can include a bottom coat side 232 and a top coat side 234 opposite the bottom coat side 232. The top coat side 234 can be coplanar with one side of the routable distribution layer 202. For illustrative purposes, a plane of the top coat side 234 is shown coplanar with the plane of one side of the routable distribution layer 202, although it is understood that a plane of the top coat side 234 can be non-coplanar with the routable distribution layer 202.

It has been discovered that the protective coat 226 in direct contact with the encapsulation 102 and the routable distribution layer 202 improves reliability by holding the routable distribution layer 202 in place, preventing distortion and electrical disconnection, electrically isolating instances of the trace contact 208 from one another, and eliminating solder creep.

It has been discovered that the routable distribution layer 202 peeled off from a leadframe and embedded within the encapsulation 102 can reduce package profile, reduce materials used, reduce number of wires used, and reduce assembly complexity. The routable distribution layer 202 peeled off from the leadframe can support high I/O (inputs and output) devices without additional process steps. For example, the routable distribution layer 202 can support 200 to 400 inputs and outputs.

It has been discovered that the external interconnect 224 directly on the routable distribution layer 202 and partially submerged in the protective coat 226 can improve board level reliability performance. Because the external interconnect 224 is supported by partially submerging in the protective coat 226 and is in directly in contact with the routable distribution layer 202, the external interconnect 224 is more resistant to external stress and its height can be adjusted without compromising board level reliability.

Figure 3:
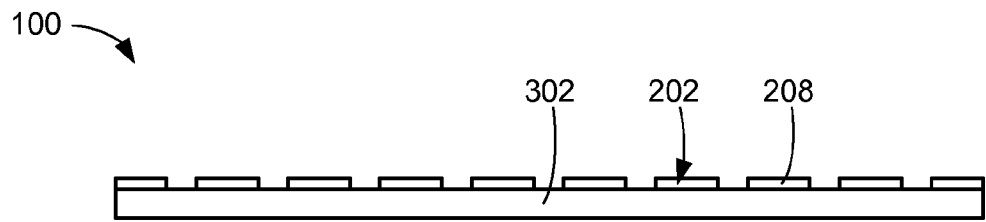
FIG. 3 is a cross-sectional view of the integrated circuit packaging system of FIG. 1 in a distribution layer formation phase of manufacturing.

Referring now to FIG. 3, therein is shown a cross-sectional view of the integrated circuit packaging system 100 of FIG. 1 in a distribution layer formation phase of manufacturing. The integrated circuit packaging system 100 can include the distribution layer formation process to provide the routable distribution layer 202 in the integrated circuit packaging system 100. The routable distribution layer 202 can be plated onto a leadframe 302. The routable distribution layer 202 can be a single layer or multiple layers. The routable distribution layer 202 can include multiple separate pieces each ending in at least one instance of the trace contact 208.

The routable distribution layer 202 can be formed with a dissimilar metal from a material used in the leadframe 302. The leadframe 302 can be pre-processed such that an external stimulus can cause it to separate from the routable distribution layer 202. The routable distribution layer 202 can be pre-processed such that the external stimulus can cause it to separate from the leadframe 302. When the external stimulus is applied, the leadframe 302 can be peeled off from the routable distribution layer 202.

The leadframe 302 can include a photopolymer layer. The photopolymer layer can be in direct contact with the routable distribution layer 202 for transforming the leadframe 302 to be more easily peeled from the routable distribution layer 202 when a light wave is applied.

The leadframe 302 can include a thermal release tape. The thermal release tape can be in direct contact with the routable distribution layer 202 for transforming the leadframe 302 to be more easily peeled from the routable distribution layer 202 when temperature of the leadframe 302 changes.

The routable distribution layer 202 can include Nickel (Ni), Palladium (Pd), Gold (Au), equivalents of these metals, or a combination thereof. The routable distribution layer 202 can be preserved after the leadframe is removed because of the difference in materials used in the routable distribution layer 202 and the leadframe 302. For example, if an etching process is applied to remove the leadframe 302, the etchant can be selected to remove only the material of the leadframe 302, such as copper, and not the material of the routable distribution layer 202.

Figure 4:
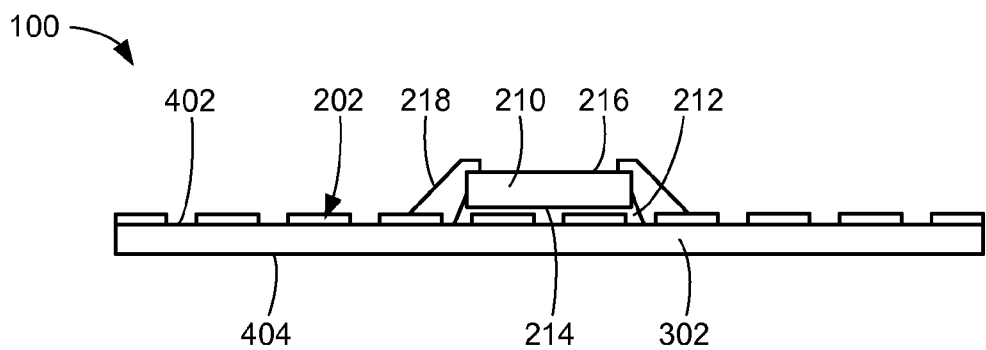
FIG. 4 is a cross-sectional view of the integrated circuit packaging system of FIG. 1 in a die attachment phase of manufacturing.

Referring now to FIG. 4, therein is shown a cross-sectional view of the integrated circuit packaging system 100 of FIG. 1 in a die attachment phase of manufacturing. The integrated circuit packaging system 100 can include the die attachment process to mount the integrated circuit 210 over the routable distribution layer 202.

The integrated circuit 210 can include the inactive side 214 facing a top leadframe side 402 of the leadframe 302 opposite a bottom leadframe side 404 of the leadframe 302. The integrated circuit 210 can be attached to the top leadframe side 402 and the routable distribution layer 202 with the attachment layer 212. The integrated circuit packaging system 100 can include the die interconnect 218 attached to the routable distribution layer 202 and the active side 216.

Figure 5:
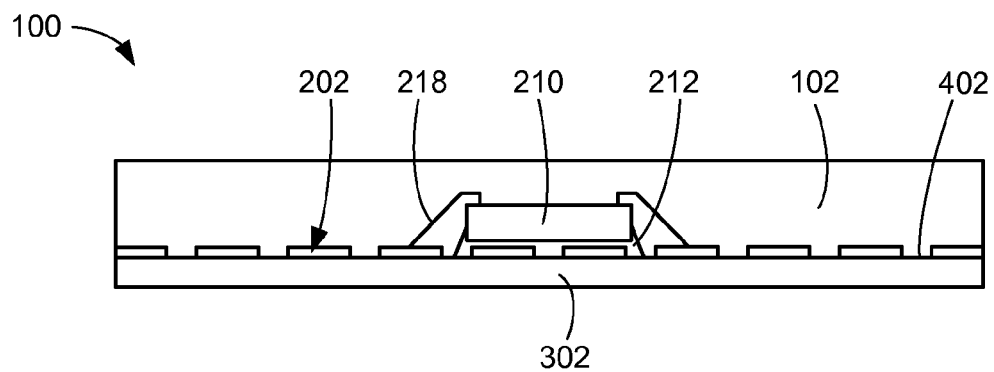
FIG. 5 is a cross-sectional view of the integrated circuit packaging system of FIG. 1 in an encapsulation phase of manufacturing.

Referring now to FIG. 5, therein is shown a cross-sectional view of the integrated circuit packaging system 100 of FIG. 1 in an encapsulation phase of manufacturing. The integrated circuit packaging system 100 can include the encapsulation process, such as a molding process or a liquid epoxy mold process, to form the encapsulation 102.

For example, the encapsulation 102 can be molded over the routable distribution layer 202 and the integrated circuit 210. The encapsulation 102 can be in direct contact with the routable distribution layer 202 and the integrated circuit 210. The encapsulation 102 can also encapsulate the die interconnect 218 and the attachment layer 212. The encapsulation 102 can be formed covering the top leadframe side 402, the routable distribution layer 202, the integrated circuit 210, and the die interconnect 218. The encapsulation 102 can be cured after the encapsulation 102 is molded over the routable distribution layer 202.

Figure 6:
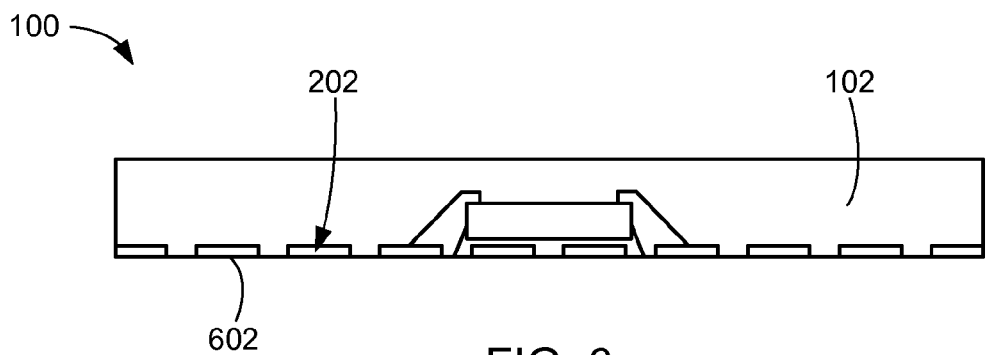
FIG. 6 is a cross-sectional view of the integrated circuit packaging system of FIG. 1 in a lead metal removal phase of manufacturing.

Referring now to FIG. 6, therein is shown a cross-sectional view of the integrated circuit packaging system 100 of FIG. 1 in a lead metal removal phase of manufacturing. The lead metal removal process can include etching or peeling for exposing the bottom distribution side 204 of FIG. 2 of the routable distribution layer 202. For example, the removal process can include a metal etching process, such as copper etching, gold alloy etching, or other metal etching. The removal process can function to remove the leadframe 302 of FIG. 3 completely or partially.

Removal of the leadframe 302 can expose a contact bottom side 602 of the routable distribution layer 202. The entirety of the leadframe 302 can be removed with the routable distribution layer 202 intact with the encapsulation 102. The leadframe 302 can serve as a sacrificial lead frame used to provide an ultra slim integrated circuit package.

For illustrative purposes, the removal process is shown to remove the entirety of the leadframe 302, although it is understood that alternatively, the leadframe 302 can be only partially removed. For illustrative purposes, the routable distribution layer 202 appears to stay the same through the lead removal process, but it is understood that the routable distribution layer 202 can be partially removed or have characteristics of having been partially etched, such as etch marks.

The removal process can include a peeling process. In the peeling process, the leadframe 302 is peeled leaving the routable distribution layer 202 with the encapsulation 102. The encapsulation 102 can firmly hold the routable distribution layer 202 during the peeling process. The peeling process can include chilling or heating the routable distribution layer 202 and the leadframe 302, mechanically securing the routable distribution layer 202 and the encapsulation 102, and peeling the leadframe 302 apart from the routable distribution layer 202 and the encapsulation 102.

Heating the leadframe 302 up to an elevated temperature can facilitate the release of the leadframe 302 from the encapsulation 102 and the routable distribution layer 202. For example, the elevated temperature can be at a temperature of 190 degree Celsius and above.

It has been discovered peeling the leadframe 302 away from the routable distribution layer 202 can provide the integrated circuit packaging system 100 with the routable distribution layer 202 that is cleaner and more reliable for making electrical contacts. Peeling the leadframe 302 away from the routable distribution layer 202 insures that the leadframe 302 which is made with a different material compared to the routable distribution layer 202 would be completely removed. Because no residue of the leadframe 302 is left after the peeling process, the routable distribution layer 202 would not have metallic residues and oxidized residues causing electrical shorts and electrical opens. No fine adjustment of an etching agent is required in this process. Damage to the routable distribution layer 202 is also minimized with the peeling process.

It has been discovered peeling the leadframe 302 entirely leaving with the routable distribution layer 202 held together by the encapsulation 102 can provide slim integrated circuit packages with high thermal dissipation properties. By providing the pattern for the routable distribution layer 202 from the leadframe 302 and removing the leadframe 302 in a removal stage, the integrated circuit package can be formed over only metallic contacts for thermal conduction without a bulky substrate or die paddle.

Figure 7:
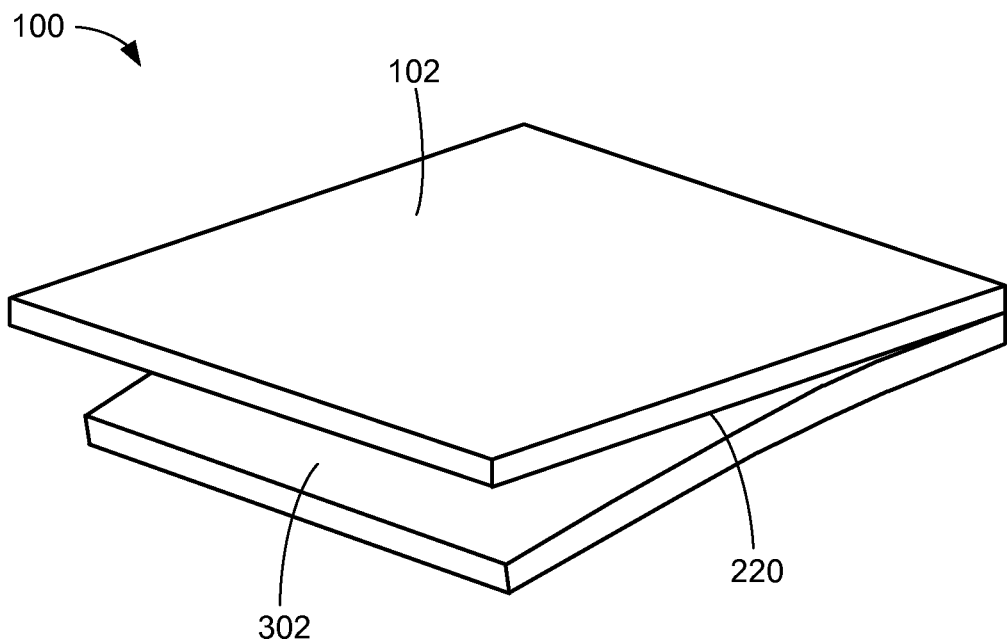
FIG. 7 is a perspective view of the integrated circuit packaging system of FIG. 1 in a lead metal removal phase of manufacturing.

Referring now to FIG. 7, therein is shown a perspective view of the integrated circuit packaging system 100 of FIG. 1 in a lead metal removal phase of manufacturing. FIG. 7 illustrates the peeling process where the leadframe 302 is stripped from the routable distribution layer 202 of FIG. 2 that is held together by the encapsulation 102. The leadframe 302 can be removed without bending or cracking the routable distribution layer 202 embedded within the encapsulation 102. The leadframe 302 can be removed leaving the bottom encapsulation side 220 co-planar with the top distribution side 206 of FIG. 2.

Figure 8:
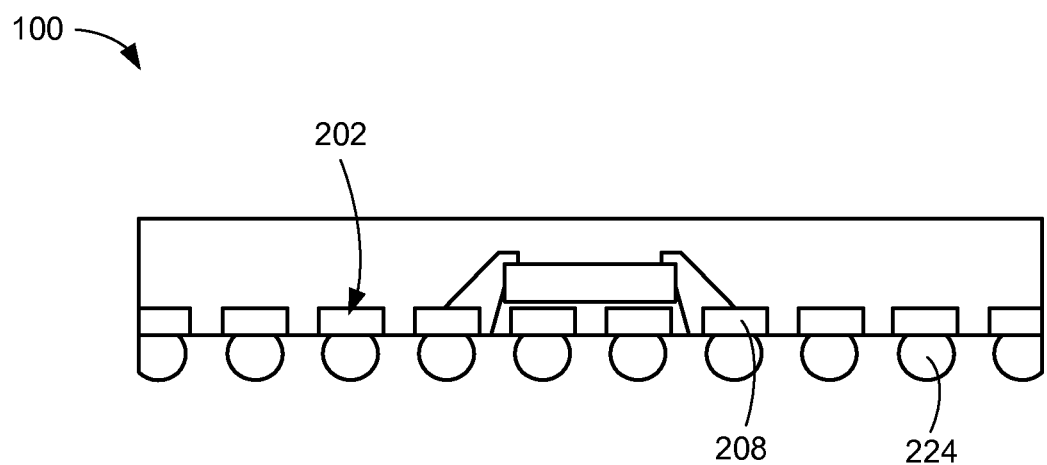
FIG. 8 is a cross-sectional view of the integrated circuit packaging system of FIG. 1 in an interconnect attachment phase of manufacturing.

Referring now to FIG. 8, therein is shown a cross-sectional view of the integrated circuit packaging system 100 of FIG. 1 in an interconnect attachment phase of manufacturing. The integrated circuit packaging system 100 can include the interconnect attachment process for making electrical contacts from the routable distribution layer 202. The interconnect attachment process can include attaching the external interconnect 224 over the routable distribution layer 202.

The external interconnect 224 can be mounted over the trace contact 208 of the routable distribution layer 202. The external interconnect 224 can be mounted in direct contact with the trace contact 208. Multiple instances of the external interconnect 224 can be mounted on the routable distribution layer 202. The external interconnect 224 can be for providing the integrated circuit packaging system 100 with electrical connection to external systems, such as a printed circuit board.

After the interconnect attachment phase of manufacturing, the protective coat 226 of FIG. 2 can be applied. For example, the protective coat 226 can be but are not limited to a solder mask, a film sheet, a mold compound, a liquid encapsulant, a powder encapsulant, or a combination thereof. The protective coat 226 can be applied with the coat height 228 of FIG. 2 not exceeding the connector height 230 of FIG. 2 of the external interconnect 224.

Figure 9:
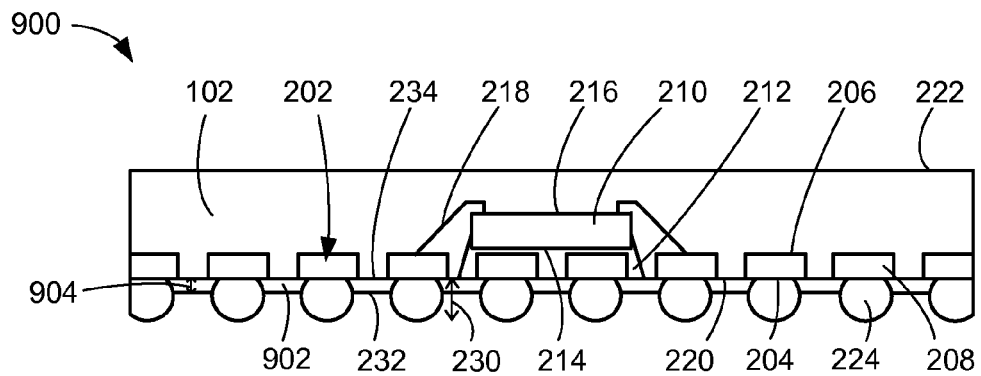
FIG. 9 is a cross-sectional view of an integrated circuit packaging system as exemplified by the top view along line 2-2 of FIG. 1 in a second embodiment of the present invention.

Referring now to FIG. 9, therein is shown a cross-sectional view of an integrated circuit packaging system 900 as exemplified by the top view along line 2-2 of FIG. 1 in a second embodiment of the present invention.

The integrated circuit packaging system 900 can include a routable distribution layer 202, which is defined as a structure for providing electrical connectivity. The routable distribution layer 202 can include a bottom distribution side 204 opposite from a top distribution side 206.

The routable distribution layer 202 can be, for example, a conductive polymer layer or a plated metal layer. The routable distribution layer 202 can have characteristics of having a leadframe removed therefrom. The characteristics of the routable distribution layer 202 having the leadframe removed therefrom can include characteristics of having the leadframe etched away therefrom. The characteristics of the routable distribution layer 202 having the leadframe etched away therefrom include etch marks, chemical residue, metal residue, or a combination thereof on a surface of the routable distribution layer 202.

The characteristics of the routable distribution layer 202 having the leadframe removed therefrom can include characteristics of the routable distribution layer 202 having the leadframe peeled off therefrom. The characteristics of the routable distribution layer 202 having the leadframe peeled off therefrom can include a smooth surface or tear marks at a periphery of the routable distribution layer 202. The characteristics of the routable distribution layer 202 having the leadframe peeled off therefrom can include the bottom distribution side 204 of the routable distribution layer 202 having a texture of the leadframe or a directional texture in the peel direction.

The encapsulation 102 can have characteristics of having a leadframe peeled off therefrom. The encapsulation 102 can include tear marks or uniform distortion along a peel direction on surfaces near, adjacent, or in contact with the routable distribution layer 202.

The routable distribution layer 202 can include multiple instances of a trace contact 208. An instance of the trace contact 208 can be connected to another instance of the trace contact 208 through the routable distribution layer 202. The routable distribution layer 202 can be a layer of interconnected metal pieces. The routable distribution layer 202 can also be a layer of separate sets of the trace contact 208.

The integrated circuit packaging system 900 can include an integrated circuit 210. The integrated circuit 210 is defined as an active device having active circuitry fabricated thereon. The integrated circuit 210 can be mounted over the routable distribution layer 202. The integrated circuit 210 can be attached to the routable distribution layer 202 with an attachment layer 212, which is defined as a material for attaching the integrated circuit 210. The attachment layer 212 can be an adhesive material. The attachment layer 212 can also be an underfill material.

The integrated circuit 210 can include an inactive side 214 and an active side 216 opposite the inactive side 214. For example, the integrated circuit 210 can be a wirebond chip, a flip chip, or a silicon (Si) die. The integrated circuit 210 can include the inactive side 214 facing the routable distribution layer 202. The integrated circuit 210 can be surrounded by an array of instances of the trace contact 208.

The integrated circuit packaging system 900 can include a die interconnect 218, which is defined as an electrically conductive connector. The die interconnect 218 can be connected to or attached to the routable distribution layer 202 and the active side 216. The integrated circuit packaging system 900 can include a plurality of the die interconnect 218. For example, the die interconnect 218 can be an electrical connector including a wire interconnect, a bond wire, a conductive bump, a solder ball, or a combination thereof.

The integrated circuit packaging system 900 can include the encapsulation 102. The encapsulation 102 can be formed covering over the routable distribution layer 202, the integrated circuit 210, the attachment layer 212, and the die interconnect 218. The encapsulation 102 can include a bottom encapsulation side 220 opposite from a top encapsulation side 222. The bottom encapsulation side 220 can be coplanar with the trace contact 208 or the bottom distribution side 204 of the routable distribution layer 202.

The integrated circuit packaging system 900 can include an external interconnect 224, which is defined as an electrically conductive connector. The external interconnect 224 can be below the trace contact 208 of the routable distribution layer 202. The external interconnect 224 can be connected to or directly attached to the trace contact 208. The integrated circuit packaging system 900 can include multiple instances of the external interconnect 224.

For example, the external interconnect 224 can be an electrical connector including a conductive pillar or a solder ball. Also for example, the external interconnect 224 can be formed with a conductive material including solder, a conductive polymer, a metal, or a metallic alloy. For a specific example, the external interconnect 224 can be a solder ball for enhancing board level reliability performance. The external interconnect 224 can be attached to the trace contact 208.

The integrated circuit packaging system 900 can include a penetrable adhesive 902, which is defined as a protection layer pressed over the external interconnect 224 onto the routable distribution layer 202. The penetrable adhesive 902 can be an adhesive film. The penetrable adhesive 902 can isolate electrically the trace contact 208 from other instances of the trace contact 208. The penetrable adhesive 902 can be made from an insulation material. The penetrable adhesive 902 can be at an adhesive height 904 less than the connector height 230 of the external interconnect 224.

The penetrable adhesive 902 can be applied for protection or security of circuit or trace, as shown with the routable distribution layer 202 for example. The penetrable adhesive 902 can be provided for protections from chemical etch out after assembly or undesired environmental conditions.

The penetrable adhesive 902 can be pressed directly on portions of the routable distribution layer 202, the encapsulation 102, or a combination thereof. The penetrable adhesive 902 can be pressed between the routable distribution layer 202 and another instance of the routable distribution layer 202. The penetrable adhesive 902 can electrically isolate the routable distribution layer 202 from another instance of the routable distribution layer 202. The penetrable adhesive 902 can be pressed on the routable distribution layer 202 around the external interconnect 224.

The penetrable adhesive 902 can be a penetrable film adhesive material. The penetrable adhesive 902 can be a B-stage material.

The penetrable adhesive 902 can have characteristics of having once been attached to and stripped away from another adhesive. For example, the penetrable adhesive 902 can have residues of another adhesive, such as an Ultra Violet light (UV) triggered adhesive, a B-stage film adhesive, or a UV B-stage film adhesive.

The penetrable adhesive 902 can have physical characteristics of having been pressed onto the routable distribution layer 202 such as tear marks near a peripheral region of the penetrable adhesive, away from the portion of the routable distribution layer 202 under the integrated circuit 210. The penetrable adhesive 902 can have physical characteristics of having been pressed onto the routable distribution layer 202 such as a higher density adjacent to the routable distribution layer 202 compared to the rest of the penetrable adhesive 902. The penetrable adhesive 902 can fully cover and protect the routable distribution layer 202 from outside hazards and contamination.

The penetrable adhesive 902 can include the bottom coat side 232 and the top coat side 234 opposite the bottom coat side 232. A plane of the top coat side 234 can be coplanar with one side of the routable distribution layer 202. For illustrative purposes, a plane of the top coat side 234 is shown coplanar with the plane of one side of the routable distribution layer 202, although it is understood that a plane of the top coat side 234 can be non-coplanar with the routable distribution layer 202.

It has been discovered that the penetrable adhesive 902 in direct contact with the encapsulation 102 and the routable distribution layer 202 improves reliability by holding the routable distribution layer 202 in place, preventing distortion and electrical disconnection, electrically isolating instances of the trace contact 208 from one another, and eliminating solder creep.

It has been discovered that the routable distribution layer 202 peeled off from a leadframe embedded within the encapsulation 102 can reduce package profile, reduce materials used, reduce number of wires used, and reduce assembly complexity. The routable distribution layer 202 peeled off from the leadframe can support high I/O (inputs and output) devices without additional process steps. For example, the routable distribution layer 202 can support 200 to 400 inputs and outputs.

It has been discovered that the external interconnect 224 directly on the routable distribution layer 202 and partially submerged in the penetrable adhesive 902 can improve board level reliability performance. Because the external interconnect 224 is supported by partially submerging in the penetrable adhesive 902 and is in directly in contact with the routable distribution layer 202, the external interconnect 224 is more resistant to external stress and its height can be adjusted without compromising board level reliability.

Figure 10:
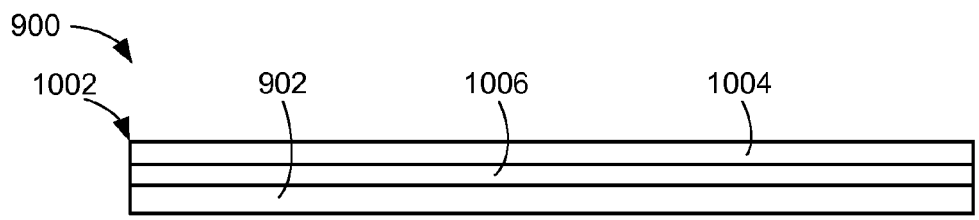
FIG. 10 is a cross-sectional view of the integrated circuit packaging system of FIG. 9 in an adhesive provision phase of manufacturing.

Referring now to FIG. 10, therein is shown a cross-sectional view of the integrated circuit packaging system 900 of FIG. 9 in an adhesive provision phase of manufacturing. The formation of the integrated circuit packaging system 900 can follow the manufacturing phases of FIGS. 3-8. Following the interconnect attachment phase of manufacturing, the integrated circuit packaging system 900 can include the adhesive provision process for forming the penetrable adhesive 902 before the penetrable adhesive 902 is applied to the routable distribution layer 202 of FIG. 2.

The adhesive provision process can include forming a multilayer adhesive 1002. The multilayer adhesive 1002 can be a multi-layered film. The multilayer adhesive 1002 can include a base adhesive 1004. The base adhesive 1004 is an adhesive layer designed to attach strongly to a trigger adhesive 1006. The base adhesive 1004 can be a film adhesive.

The multilayer adhesive 1002 can include the trigger adhesive 1006. The trigger adhesive 1006 can be attached to the base adhesive 1004. The trigger adhesive 1006 is defined as a film adhesive that changes its adhesive property based on an external stimulus. For example, the trigger adhesive 1006 can be a UV film adhesive or a heat sensitive film adhesive. The trigger adhesive 1006 can become flowable when heated to an elevated temperature. The trigger adhesive 1006 can respond to an exposure to UV light by becoming more flowable. The trigger adhesive 1006 can be a B-stage film adhesive layer.

The multilayer adhesive 1002 can include the penetrable adhesive 902. The penetrable adhesive 902 can be attached to the trigger adhesive 1006. The penetrable adhesive 902 is defined as an adhesive layer that can be pressed over other solid structures. The penetrable adhesive 902 can be pressed over other solid structures without damaging the structures. The penetrable adhesive 902 can be pressed over other solid structures without cracking or falling off from the trigger adhesive 1006.

Figure 11:
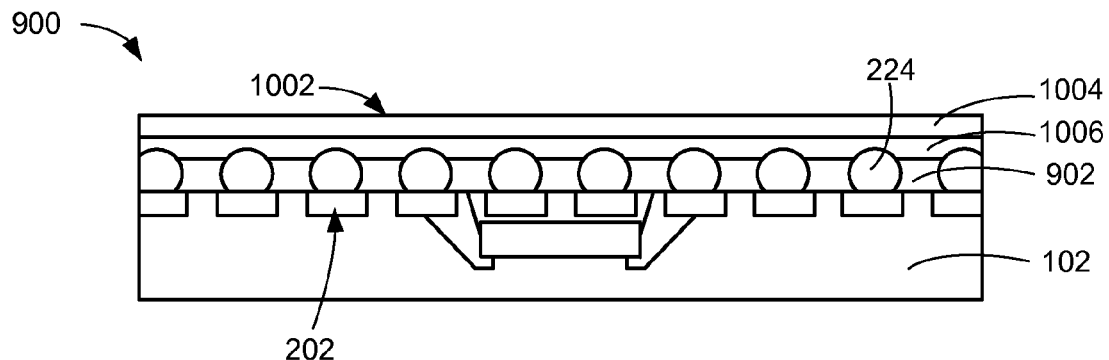
FIG. 11 is a cross-sectional view of the integrated circuit packaging system of FIG. 9 in an adhesive application phase of manufacturing.

Referring now to FIG. 11, therein is shown a cross-sectional view of the integrated circuit packaging system 900 of FIG. 9 in an adhesive application phase of manufacturing. The integrated circuit packaging system 900 can include the adhesive application process for applying the penetrable adhesive 902 on the routable distribution layer 202.

The adhesive application process can include applying the multilayer adhesive 1002 over the routable distribution layer 202. The multilayer adhesive 1002 can be pressed onto the routable distribution layer 202 and the encapsulation 102. The multilayer adhesive 1002 can be pressed around the external interconnect 224. The multilayer adhesive 1002 can be pressed over the external interconnect 224 without damaging or cracking the external interconnect 224.

When pressed over the external interconnect 224, the external interconnect 224 can penetrate into the penetrable adhesive 902. The external interconnect 224 can penetrate through the penetrable adhesive 902 and partially into the trigger adhesive 1006. The external interconnect 224 can penetrate through the trigger adhesive 1006 without penetrating into the base adhesive 1004.

Figure 12:
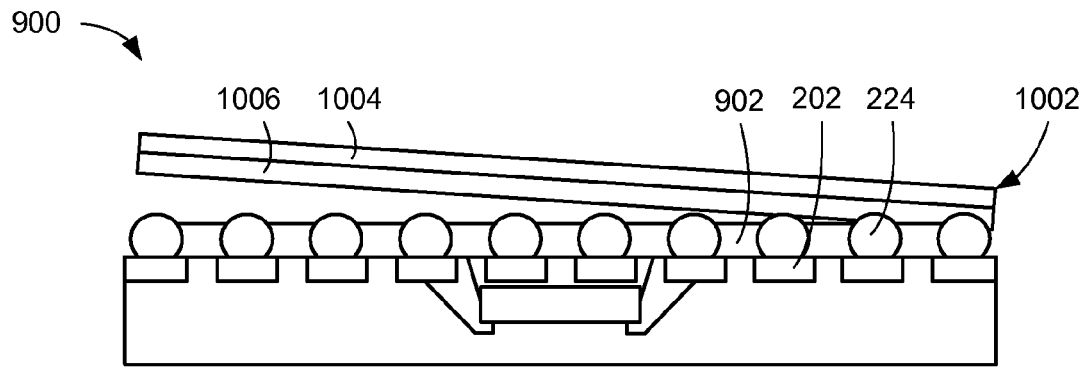
FIG. 12 is a cross-sectional view of the integrated circuit packaging system of FIG. 9 in an adhesive stripping phase of manufacturing.

Referring now to FIG. 12, therein is shown a cross-sectional view of the integrated circuit packaging system 900 of FIG. 9 in an adhesive stripping phase of manufacturing. The integrated circuit packaging system 900 can include the adhesive stripping process for exposing the external interconnect 224 from the multilayer adhesive 1002.

An external stimulus can be applied on the trigger adhesive 1006 or the base adhesive 1004 to cause the trigger adhesive 1006 to become more flowable. The base adhesive 1004 can retain adhesive properties with the trigger adhesive 1006 after the external stimulus is applied. The base adhesive 1004 and the trigger adhesive 1006 can be removed from the penetrable adhesive 902. For example, the base adhesive 1004 and the trigger adhesive 1006 can be stripped from the penetrable adhesive 902. The penetrable adhesive 902 can be cured once it is pressed on the routable distribution layer 202.

The penetrable adhesive 902 can have physical characteristics of having been detached from the trigger adhesive 1006 by peeling the trigger adhesive 1006 therefrom. For example, the penetrable adhesive 902 can have a surface with a texture or a pattern of a surface of the trigger adhesive 1006. The penetrable adhesive 902 can have a surface with residues of the trigger adhesive 1006.

The trigger adhesive 1006 can expose the external interconnect 224 partially for electrical connectivity purposes. The trigger adhesive 1006 can partially cover and protect the external interconnect 224.

It has been discovered that peeling the trigger adhesive 1006 from the penetrable adhesive 902 provides the integrated circuit packaging system 900 with improve electrical connectivity and heighten reliability. Peeling the trigger adhesive 1006 from the penetrable adhesive 902 provides the penetrable adhesive 902 with a smooth even surface after it is firmly pressed around the external interconnect 224 and onto the routable distribution layer 202. The smooth even surface can isolate the external interconnect 224 without damaging the external interconnect 224 or covering a bottom portion of the external interconnect 224 for electrical connectivity.

Figure 13:
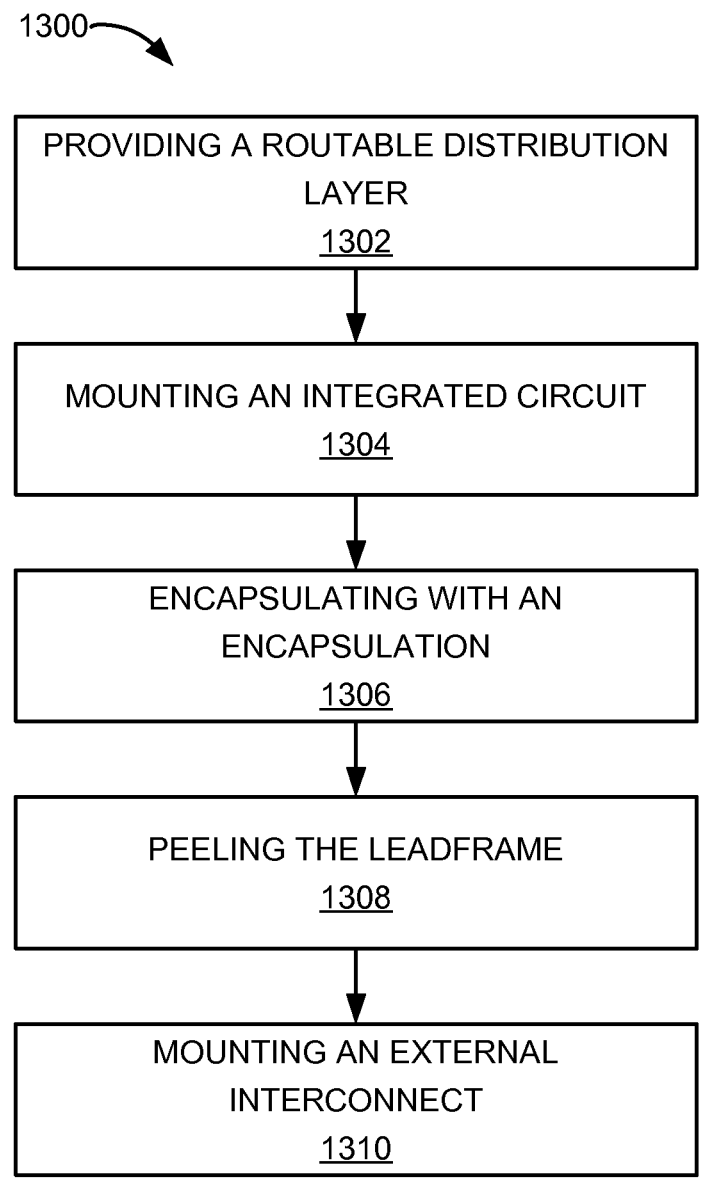
FIG. 13 is a flow chart of a method of manufacture of an integrated circuit packaging system in a further embodiment of the present invention.

Referring now to FIG. 13, therein is shown a flow chart of a method 1300 of manufacture of an integrated circuit packaging system in a further embodiment of the present invention. The method 1300 includes: providing a routable distribution layer on a leadframe in a block 1302; mounting an integrated circuit over the routable distribution layer in a block 1304; encapsulating with an encapsulation over the routable distribution layer in a block 1306; peeling the leadframe away from the routable distribution layer with a bottom distribution side of the routable distribution layer exposed from the encapsulation in a block 1308; and mounting an external interconnect on the routable distribution layer in a block 1310.

Thus, it has been discovered that the integrated circuit packaging system of the present invention furnishes important and heretofore unknown and unavailable solutions, capabilities, and functional aspects for an integrated circuit packaging system with connection. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
providing a routable distribution layer on a leadframe;
mounting an integrated circuit over the routable distribution layer;
encapsulating with an encapsulation over the integrated circuit and the routable distribution layer;
peeling the leadframe away from the routable distribution layer with a bottom distribution side of the routable distribution layer exposed from the encapsulation and having the characteristics of the leadframe peeled off therefrom;
mounting an external interconnect on a bottom distribution side, of the routable distribution layer, coplanar with a bottom side of an attachment layer and the external interconnect below the integrated circuit; and
applying a protective coat directly on the external interconnect, the routable distribution layer, and the encapsulation with the external interconnect having a connector height of the external interconnect greater than a coat height of the protective coat, and the external interconnect exposed from the protective coat.

2. The method as claimed in claim 1 wherein peeling the leadframe includes heating the leadframe.

3. The method as claimed in claim 1 wherein peeling the leadframe includes peeling the leadframe away from the encapsulation.

4. The method as claimed in claim 1 wherein mounting the integrated circuit includes applying the attachment layer co-planar to a bottom encapsulation side of the encapsulation.

5. The method as claimed in claim 1 wherein encapsulating with the encapsulation over the routable distribution layer includes encapsulating with the encapsulation having a bottom encapsulation side co-planar with the bottom distribution side of the routable distribution layer.

6. A method of manufacture of an integrated circuit packaging system comprising:
providing a routable distribution layer on a leadframe;
mounting an integrated circuit on the routable distribution layer with an attachment layer;
encapsulating with an encapsulation over the integrated circuit and the routable distribution layer;
peeling the leadframe away from the routable distribution layer with a bottom distribution side of the routable distribution layer exposed from the encapsulation and having the characteristics of the leadframe peeled off therefrom;
mounting an external interconnect on the bottom distribution side, of the routable distribution layer, coplanar with a bottom side of an attachment layer and the external interconnect below the integrated circuit; and
applying a protective coat directly on the external interconnect, the routable distribution layer, and the encapsulation with the external interconnect having a connector height of the external interconnect greater than a coat height of the protective coat, and the external interconnect exposed from the protective coat.

7. The method as claimed in claim 6 wherein applying the protective coat includes pressing the protective coat over the external interconnect onto the routable distribution layer.

8. The method as claimed in claim 6 wherein applying the protective coat includes applying the protective coat with the protective coat having the characteristics of being detached from a trigger adhesive.

9. The method as claimed in claim 6 wherein applying the protective coat includes applying a solder mask as the protective coat.

10. The method as claimed in claim 6 wherein applying the protective coat includes applying a powder encapsulant as the protective coat.

11. An integrated circuit packaging system comprising:
a routable distribution layer having the characteristics of a leadframe peeled off therefrom;
an integrated circuit over the routable distribution layer;
an encapsulation over the integrated circuit and the routable distribution layer with the bottom distribution side of the routable distribution layer exposed from the encapsulation;
an external interconnect on a bottom distribution side, of the routable distribution layer, coplanar with a bottom side of an attachment layer and the external interconnect below the integrated circuit; and
applying a protective coat directly on the external interconnect, the routable distribution layer, and the encapsulation with the external interconnect having a connector height of the external interconnect greater than a coat height of the protective coat, and the external interconnect exposed from the protective coat.

12. The integrated circuit packaging system as claimed in claim 11 wherein the routable distribution layer includes a tear marked distribution side, characteristic of having the leadframe peeled off therefrom.

13. The integrated circuit packaging system as claimed in claim 11 wherein the encapsulation includes a tear marked encapsulation side adjacent to the routable distribution layer 202, characteristic of having the leadframe peeled off therefrom.

14. The integrated circuit packaging system as claimed in claim 11 wherein the attachment layer between the integrated circuit and the routable distribution layer with the bottom side of the attachment layer co-planar with a bottom encapsulation side of the encapsulation.

15. The integrated circuit packaging system as claimed in claim 11 wherein the encapsulation having a bottom encapsulation side co-planar with the bottom distribution side of the routable distribution layer.

16. The integrated circuit packaging system as claimed in claim 11 further comprising:
   the protective coat over the routable distribution layer and the encapsulation with the external interconnect exposed from the protective coat; and
   wherein the attachment layer is between the integrated circuit and the routable distribution layer.

17. The integrated circuit packaging system as claimed in claim 16 wherein the protective coat includes a penetrable adhesive.

18. The integrated circuit packaging system as claimed in claim 16 wherein the protective coat has the characteristics of being detached from a trigger adhesive.

19. The integrated circuit packaging system as claimed in claim 16 wherein the protective coat is a solder mask.

20. The integrated circuit packaging system as claimed in claim 16 wherein the protective coat is a powder encapsulant.

\* \* \* \* \*